United States Patent
Soong

(10) Patent No.: US 8,128,858 B2
(45) Date of Patent: Mar. 6, 2012

(54) METHODS UTILIZING REVERSIBLY ADHESIVE LAYERS FOR FORMING PATTERNED MICROSTRUCTURES

(75) Inventor: Ricky K. Soong, Cambridge, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 162 days.

(21) Appl. No.: 12/727,518

(22) Filed: Mar. 19, 2010

(65) Prior Publication Data
US 2010/0244332 A1      Sep. 30, 2010

Related U.S. Application Data

(60) Provisional application No. 61/211,187, filed on Mar. 26, 2009.

(51) Int. Cl.
*B29C 35/08* (2006.01)
*B29C 33/56* (2006.01)
*B28B 7/36* (2006.01)

(52) U.S. Cl. ............ 264/496; 264/338; 249/114.1; 249/115

(58) Field of Classification Search ............ 264/496, 264/338; 249/114.1, 115
See application file for complete search history.

(56) References Cited

U.S. PATENT DOCUMENTS

| | | |
|---|---|---|
| 3,891,584 A | 6/1975 | Ray-Chaudhuri et al. |
| 5,834,538 A | 11/1998 | deHullu et al. |
| 5,883,211 A | 3/1999 | Sassi et al. |
| 6,133,405 A | 10/2000 | Allen |
| 6,190,689 B1 | 2/2001 | Hoffmann et al. |
| 6,803,085 B2 | 10/2004 | Blom et al. |
| 6,964,805 B1 | 11/2005 | Kuriyama et al. |
| 2005/0281881 A1 | 12/2005 | Woeller et al. |
| 2006/0122298 A1 | 6/2006 | Menon et al. |
| 2008/0012184 A1* | 1/2008 | Chou ................... 264/496 |
| 2008/0140192 A1 | 6/2008 | Humayun et al. |
| 2009/0022909 A1 | 1/2009 | Kim et al. |

FOREIGN PATENT DOCUMENTS

| | | |
|---|---|---|
| GB | 2411881 A | 9/2005 |
| JP | 55076378 A | 6/1980 |
| JP | 5306380 A | 11/1993 |
| JP | 2002140009 A | 5/2002 |
| JP | 2004013140 A | 1/2004 |
| JP | 2006241264 A | 9/2006 |

* cited by examiner

*Primary Examiner* — Yogendra Gupta
*Assistant Examiner* — Alison Hindenlang
(74) *Attorney, Agent, or Firm* — Goodwin Procter LLP

(57) ABSTRACT

A method for forming a nano/microstructure includes applying a release coating having a transition temperature to a mold, the release coating promoting adhesion thereto at temperatures below the transition temperature and release at temperatures above the transition temperature. A cast material is adhered to the release coating at a first temperature below the transition temperature and released from the mold by exposing the release coating to a second temperature greater than the transition temperature.

25 Claims, 6 Drawing Sheets

METHODS UTILIZING REVERSIBLY ADHESIVE LAYERS FOR FORMING PATTERNED MICROSTRUCTURES

CROSS-REFERENCE TO RELATED APPLICATION

This application claims priority to and the benefit of U.S. Provisional Patent Application No. 61/211,187, filed on Mar. 26, 2009, the entire disclosure of which is incorporated by reference herein.

GOVERNMENT SUPPORT

This invention was made with United States Government support under Contract No. N66001-08-C-2054 awarded by the U.S. Department of Defense. The United States Government may have certain rights in the invention.

FIELD OF THE INVENTION

In various embodiments, the present invention generally relates to a release coating that employs melting as a mechanism to switch between adhesion promotion and release of overlying layers, as well as the use of such coatings for fabrication of patterned structures.

BACKGROUND

Various materials have been employed as release layers, i.e., layers capable of releasing, on demand, layers or surfaces in contact with or in close proximity thereto. A first exemplary class of agents includes surface functionalization to reduce adhesion. These compounds are predominantly self-assembled monolayers ("SAM")—primarily silanes—that impart hydrophobicity to surfaces. Their low surface energy and hydrophobicity/hydrophilicity mismatch are intended to promote release of materials from coated surfaces. Such materials generally function only to minimize adhesion and typically do not have controllable surface energies.

A second exemplary class of materials includes specialized polymers having chemical groups with arrangements reconfigurable upon application of heat, thus enabling hydrophobicity tuning. These materials are exemplified by N-isopropyl acrylamide ("NIPAAM"), which is a polymer having a controllable surface energy. The material has a transition point at approximately 36° C., above which the polymer chains dehydrate and collapse upon each other, forming a hydrophobic layer. Below the critical temperature, the polymer chains are hydrated and hydrophilic. In the past, the polymer has been grafted on various surfaces, including glass, and has been used for temperature-controlled release of cultured cells. Above 36° C. (the nominal temperature for culturing cells is 37° C.), cells adhere to NIPAAM-coated surfaces, but at room temperature the cells may be lifted off from the polymer.

A third exemplary class of materials includes precursor additives that are mixed with a curable polymer material to impart low surface-binding energy to the bulk compound. For example, ultraviolet—("UV") curable additives have been employed in this manner. The precursor typically includes a polymerizing moiety attached to a hydrophobic group. The precursor is integrated with the bulk material through UV curing, which forms the cast while maintaining a low surface energy to reduce adhesion of a molded part.

However, none of these materials satisfy all of the following criteria for robust micro/nanolithography: (i) cost effectiveness; (ii) ease of processing and/or coating onto substrates; (iii) compatibility with micro/nanolithography processing; and (iv) tunability of surface adhesion.

For example, with SAM chemistries, surfaces are typically permanently rendered minimally adhesive. The functional group imparts low binding energy to the surface, which is generally not compatible with thin coatings that are typically needed for multi-layer micro/nanostructuring. With thin, uniform coatings, the material is usually spun onto the surface, and therefore an additional adhesive layer is needed for effective distribution under the centripetal spinning force.

The NIPAAM polymer enables thermal control of surface adhesion, but is difficult to process and implement. In addition, thin coatings that do not obstruct or distort the underlying micro/nanofeatures of a cast have not been achieved with NIPAAM and may not be possible since the nominal thickness of the NIPAAM polymer has been estimated to be at least 70-80 nm. NIPAAM grafting is generally also time intensive, typically requiring special solvents and procedures, including a nitrogen environment for successful polymerization. NIPAAM's low transition temperature also typically precludes robust micro/nanoprocessing, where temperatures greater than 36° C. are often used to process lithographic materials.

UV-curable additives and many hydrophobic materials also possess disadvantages similar to those of low-surface-energy SAM chemistries, i.e., the molded material cannot be selectively bound and unbound during processing. The additives may also be quite expensive, as they tend to be proprietary formulations, or may require unique and complicated chemical synthesis to build precursor molecules. Furthermore, because the materials are UV-curable, their use is generally limited by the optical properties of the substrate. Use of transparent substrates may cause unintended release during micro/nanoprocessing, since materials for patterning are generally also sensitive to UV radiation. The additives are also typically designed to be cured by UV exposure, and are therefore applied permanently and generally are not removable without fouling the surface of the molded part. Thus, surfaces to which UV-curable formulations are applied typically cannot achieve switchable and reversible adhesion.

SUMMARY

In accordance with certain embodiments, a coating material capable of promoting adhesion and release is provided. The coating material is simple and cost-effective to produce, typically is not UV-sensitive (i.e., exposure to UV radiation does not substantially cure or contribute to the adhesive properties thereof), and is compatible with the elevated temperatures associated with microprocessing. Generally, the coating material employs melting as a mechanism to switch between adhesion promotion and release of bonded materials. The coating material may be utilized in a variety of processes, e.g., micro/nanopatterning and mold formation for the fabrication of three-dimensional structures.

In an aspect, embodiments of the invention feature a method for forming a nano/microstructure. A release coating having a transition temperature is applied to a mold. At temperatures below the transition temperature, the release coating promotes adhesion thereto, and at temperatures above the transition temperature, the release coating promotes release. A cast material is adhered to the release coating at a first temperature below the transition temperature and then released from the mold by exposing the release coating to a second temperature greater than the transition temperature.

The cast material may be cured with affecting the transition temperature or adhesive properties (e.g., without diminishing and/or enhancing the adhesive properties) of the release coating. The curing step may include or consist essentially of exposing the cast material to actinic radiation (e.g., UV radiation) and/or heating to a temperature below the transition temperature. The mold may be transparent to the actinic radiation and the cast material may be exposed through the mold. A portion of the mold may be formed after application of the release coating, and the formation may include or consist essentially of exposing the portion of the mold to actinic radiation (e.g., UV radiation) without affecting the transition temperature or adhesive properties of the release coating.

The release coating may consist essentially or consist of agarose dissolved in water, and may be applied to the mold by spin coating. The cast material may be released from the mold by immersing the cast material, the mold, and/or the release coating in water having the second temperature. Releasing the cast material from the mold may include or consist essentially of liquefying the release coating. The cast material may be substantially free of residual release coating after release.

The thickness of the release coating may range from approximately 10 nm to approximately 50 nm. The transition temperature may be greater than approximately 36° C., e.g., greater than approximately 80° C. The release coating may be substantially insensitive to UV radiation. The release coating may be a hydrogel and/or include an additive not contributing to its adhesive properties. The additive may include or consist essentially of a coloring agent, a fluorescing agent, gelatin, and/or a salt.

The mold may include or consist essentially of a substrate having raised features thereon. The substrate may include or consist essentially of silicon and/or glass. The raised features may include or consist of a plurality of layers, at least one of which includes or consists essentially of photoresist and at least one of which includes or consists essentially of a metal. The cast material may be processed with an acid and/or a base, and/or subjected to a LIGA process, the processing not affecting the transition temperature or adhesive properties of the release coating.

In another aspect, embodiments of the invention feature a reversibly adhesive coating consisting essentially of or consisting of agarose dissolved in water. The coating has a transition temperature. At a first temperature below the transition temperature, the coating promotes adhesion of material thereto, and, at a second temperature above the transition temperature, the coating promotes release of material adhered thereto.

In yet another aspect, embodiments of the invention feature a method for forming a release coating consisting essentially of or consisting of dissolving agarose in water. The release coating consists essentially of or consists of agarose dissolved in water. The release coating has a transition temperature. At a first temperature below the transition temperature, the release coating promotes adhesion of material thereto, and, at a second temperature above the transition temperature, the release coating promotes release of material adhered thereto. The temperature of the water may be above approximately 25° C., and may even be substantially boiling.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. As used herein, the term "substantially" means±10%, and in some embodiments, ±5%.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
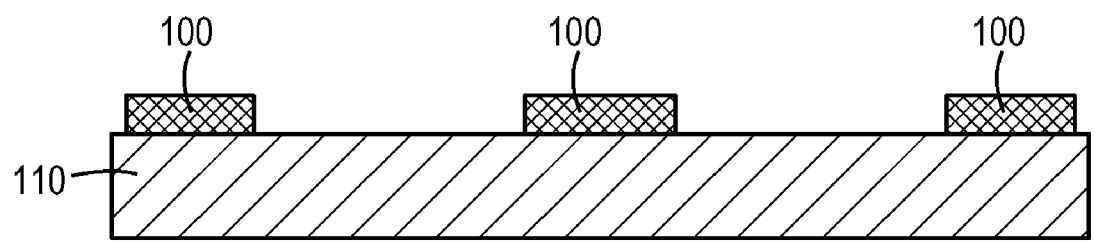
FIGS. 1-8 are cross-sectional views of a process sequence utilizing a release coating for fabricating a patterned structure in accordance with one embodiment of the invention.

A release coating, as described herein, is employed, in various embodiments, to thermally control adhesion on a substrate. Such thermally controlled adhesion is useful, for example, in applications such as complex nanolithography or multilayer patterning, and for the rapid release of high-aspect-ratio structures. The release coating may impart controlled wettability of surfaces to enable adhesion of common lithographic materials during micro/nanopatterning, and to enable the release of structures on demand without harsh chemicals or process-intensive and destructive methods. Embodiments of the coating described herein may also be used, for example, in optics where a hydrated film is required for trapping aqueous components to the surface, such as for index of refraction matching or as tuned waveguides. In various embodiments, the coating thickness may be adjusted down to tens of nanometers (e.g., ranging between approximately 10 nm and approximately 50 nm), which enables formation of ultra-thin layers that have the abovementioned variable adhesive and optical surface properties. Embodiments of the release coating can also be used for nano-imprint lithography where patterning and lift-off using water or mild solvents are desired.

Generally, the release coating is cost-effective and simple to process. In one embodiment, the release coating uses a widely available precursor component (i.e., agarose) that is dissolved in hot water. Thus, in preferred embodiments, the release coating consists essentially of agarose dissolved in water. As utilized in reference to the release coating, the phrase "consists essentially of" precludes inclusion of additional components contributing to adhesion, but allows for inclusion of components that do not so contribute, e.g., additives such as colorants or fluorescent materials (as further described below).

An exemplary method of forming the release coating includes or consists essentially of adding agarose to water at approximately 0.5% to approximately 2% weight per volume, e.g., approximately 1% weight per volume (i.e., approximately 1 gram of agarose per 100 ml of water). The water is then heated until it boils, and the agarose powder is allowed to fully dissolve, resulting in a substantially clear liquid. Occasional stirring may be performed to enhance the dissolving of the agarose powder. The resultant release coating (i.e., the heated liquid) then applied to the patterned molds for coating, as described below. Preferably the release coating is applied while still above room temperature. Release coatings including or consisting essentially of approximately 1% weight per volume agarose in water typically have thicknesses of approximately 10 nm when applied. The thickness of the coating may be increased by increasing the relative amount of agarose in the mixture and may be decreased by decreasing the relative amount of agarose in the mixture. In some embodiments, agarose having a lower melting point (i.e., a lower melting point than the approximately 80° C. melting point of typical agarose powder, e.g., approximately 50° C., or even lower) may be utilized to form the release coating. Use of such low-melting-point agarose may enable formation of release coatings having transition temperatures lower than approximately 80° C.

In various embodiments, liquid(s) other than water may be utilized in addition to or instead of water to dissolve the agarose in order to reduce the transition temperature of the release coating. Such liquids may include various electrolytes (i.e., water having any of a variety of salts dissolved therein), and/or aqueous binary solvents such as water mixed with dimethyl sulfoxide and/or N,N,-dimethylformamide (e.g., at mole fractions up to approximately 60%). Gelatin may be added to the agarose/water mixture at up to 80% by weight in order to reduce the melting temperature (and hence the transition temperature) of the release coating.

The release coating, unlike many previously employed compounds, generally achieves switchable and reversible adhesion. In one embodiment, the release coating has a transition temperature higher than that of NIPAAM (e.g., greater than 36° C.), and may even have a transition temperature greater than approximately 80° C. Generally, the coating's release mechanism is based solely on the phase transition from a solid to a liquid state (e.g., melting). Below the transition temperature, the coating material promotes adhesion of materials and/or structures thereto (and/or self-adhesion to a substrate), and above the transition temperature, the coating material promotes release of materials adhered thereto. Above the transition temperature, the coating material may even melt into a substantially liquid phase that is easily removable from a substrate, leaving substantially no residue thereon. Thus, in preferred embodiments, the release material is not "thermoresponsive" or "thermally responsive," as commonly defined—i.e., rather than promoting adhesion with elevated temperature, the adhesive properties of the coating typically diminish as temperature increases, particularly above the transition temperature, until release is finally achieved.

In various embodiments, there is no complex chemistry involved, nor is there a requirement for the design of specialized molecules and functional modalities to achieve release. Use of the release coating typically results in a surface that is hydrophilic. The release coating may be applied at thicknesses of only a few tens of nanometers (as described above), thus minimally interfering with nanostructures during nano/micropatterning. Because the release coating may be water-based, it is compatible with chemistries used for micro/nanolithography, including developers and resists, and therefore enables patterning over the coating. In one embodiment, use of the release coating also enables the simple release of structures after patterning by simple heating of the structure in water at a temperature greater than approximately 80° C. In addition, nominal hot-plate photoresist processing (e.g., at temperatures less than approximately 100° C.) tends not to disrupt the coating. In various embodiments, hot water completely dissolves the release coating and replenishes the mold surface for reapplication of the coating, therefore enabling the preservation of expensive casts. The complete dissolving of the release coating also prevents fouling of molded materials and enables the release coating to perform as a true sacrificial layer. In various embodiments, the release coating is insensitive to UV light and is therefore compatible with lithography processes.

Generally, the release coating material withstands robust micro/nanoprocessing and related chemicals at room temperature, and then releases overlying material and/or is completely dissolved away in water at higher temperatures (e.g., greater than approximately 80° C., or even greater than approximately 100° C.). In one embodiment, the release coating includes or consists essentially of agarose dissolved in water (e.g., deionized water) at a ratio selected to tune the viscosity and therefore the thickness of applied coatings. The agarose may be fully dissolved in hot water and applied hot onto surfaces using any of a variety of methods, including dip coating, monolithic pouring and pressing, or spin coating. In one embodiment, spin coating is the preferable mechanism for achieving substantially uniform layers having nanometer-scale thickness (i.e., a thickness ranging from approximately 1 nm to approximately 10 nm). The release coating is then cooled to room temperature to solidify, at which point it may be used for various applications. Release may be accomplished simply by immersing a substrate with the coating thereon into hot water to melt the release coating.

The release coating may be in the form of a hydrogel, i.e., a network of polymer chains dispersed in water. Other additives, such as coloring or fluorescing agents, may also be applied to the release coating to facilitate better visualization of surfaces and for optical applications. For example, food coloring additives may be mixed with the hydrogel solution to enable visualization of the release coating (which is typically substantially transparent and colorless). Fluorescent dyes such as rhodamine, fluorescein, and/or other agents typically used to label non-fluorescent molecules may also be added to the hydrogel liquid preparation to enhance visualization of the release coating. Furthermore, the agarose may be dissolved in a buffer containing one or more salts; with subsequent water release, osmosis may cause such release layers to swell and enable enhanced release thereof. The release coating may also be used as an index of refraction matching material for optical applications, e.g., in surface-plasmon resonance, to more efficiently couple plasmons between dielectrics and thin metallic films. The release coating may also be patterned using hot embossing to imprint and selectively "melt" away areas of the coating to form a micro/nanopattern.

FIGS. 1-12 depict exemplary implementations of the release coating for microprocessing, i.e., nano/micropatterning processes to form patterned and/or three-dimensional structures, e.g., molds for fabrication of polymer-based parts (or those based on other materials). Referring to FIG. 1, standard photolithography processes are utilized to form features 100 over a substrate 110. Substrate 110 may include or consist essentially of glass, e.g., borosilicate glass such as PYREX (e.g., Corning 7740), available from Corning Inc. of Corning, N.Y., or BOROFLOAT, available from Schott North America, Inc. of Elmsford, N.Y., and may be substantially transparent. Features 100 may be substantially rigid, and may include or consist essentially of a metal, e.g., chromium. Preferably, features 100 are substantially opaque to UV radiation and thus may act as a "mask" during subsequent photolithography exposure steps (as described below). Features 100 may be formed via deposition (e.g., by sputtering or chemical vapor deposition) of a uniform layer over substrate 110, followed by patterning by photolithography and etching. Alternatively, features 100 may be formed by a "lift-off" process, in which photoresist is uniformly deposited over substrate 110 and exposed and removed in locations in which features 100 are desired. A layer of, e.g., chromium is then deposited over the patterned photoresist, which is removed by, e.g., wet chemical processes, "lifting off" portions of the chromium where features 100 are not desired. Features 100 may have a thickness ranging from approximately 1 μm to approximately 2 μm.

Figure 2:
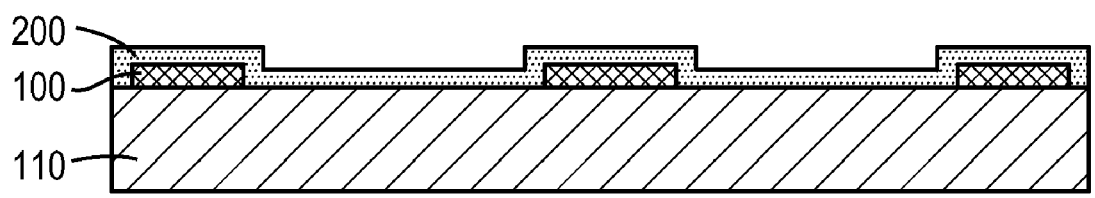
Figure 3:
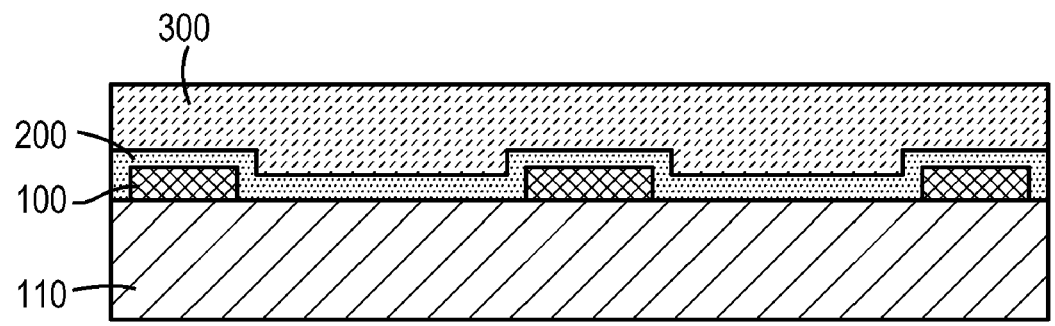

FIG. 2 depicts formation of a release coating material 200 over substrate 110, which substantially coats and covers features 100. Release coating material 200 may be any of the embodiments of the release coating described above, i.e., it may consist essentially of agarose dissolved in water. The thickness of coating material 200 may range between approximately 10 nm and approximately 50 nm, or even less than approximately 10 nm. In FIG. 3, a layer of photoresist 300 is formed over coating material 200, substantially covering the topology formed by features 100 (and coating material 200), and having a substantially planar top surface. Photoresist 300 may include or consist essentially of, e.g., AZ4620, SU-8, or Microchem LOR photoresist. In preferred embodiments, photoresist 300 is applied with a sufficiently low viscosity to substantially fill the "gaps" left by features 100 and, after baking at elevated temperature, both supplies a substantially planar surface for formation of subsequent layers and is structurally strong enough to support such layers during layer patterning and processing steps (as described below).

Figure 4:
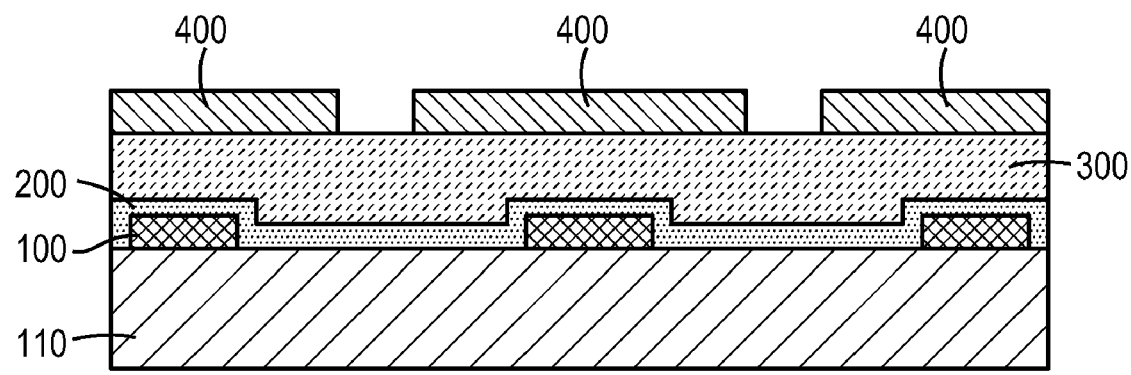
Figure 5:
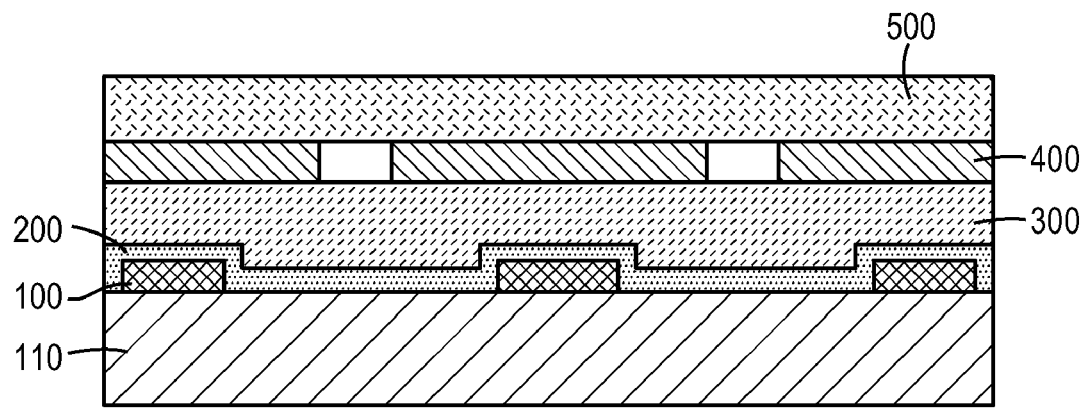

Referring now to FIG. 4, another set of features 400 are formed over photoresist 300. Features 400 may include or consist essentially of a rigid material, e.g., a metal such as chromium. Features 400 may share attributes of and/or be fabricated in substantially the same manner as features 100 described above. In FIG. 5, a layer of photoresist 500 is formed over features 400. In various embodiments, photoresist 500 does not fill (or even substantially enter) the gaps left by features 400 (as shown in FIG. 5), but in other embodiments photoresist 500 at least partially fills such gaps. Regardless, photoresist 500 typically has a substantially planar top surface after formation. Photoresist 500 may include or consist essentially of any of the photoresists described above with reference to photoresist 300.

Figure 6:
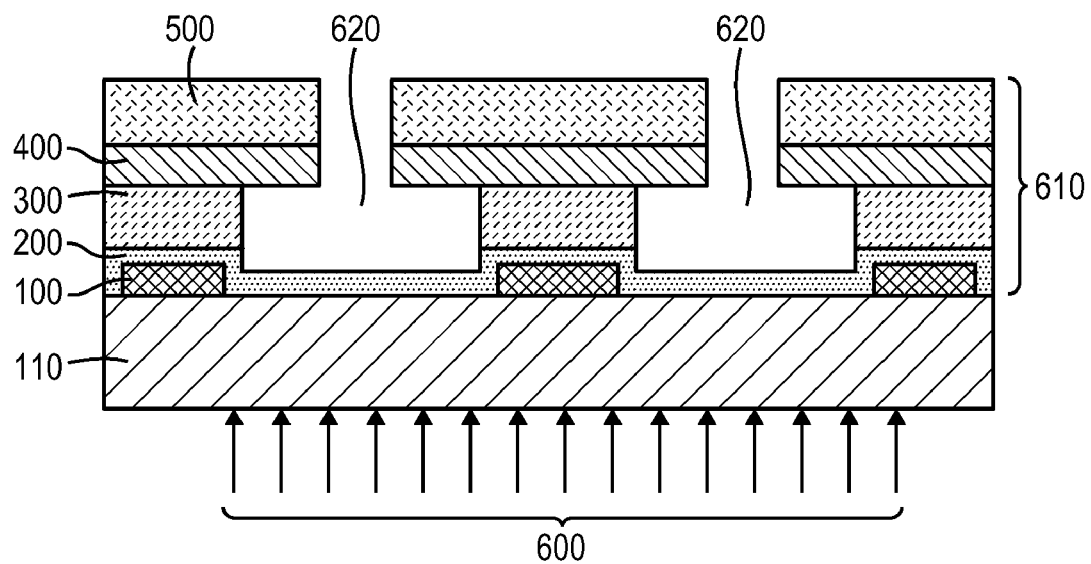

After deposition (and an optional postbake) of photoresist 500, both photoresist 300 and photoresist 500 are exposed to actinic radiation 600 (which may include or consist essentially of UV radiation), as shown in FIG. 6. In one embodiment, actinic radiation 600 is introduced from the back side of substrate 110. Thus, features 100, 400 protect (i.e., "mask") those portions of photoresists 300, 500 disposed immediately thereover from exposure to the radiation. As shown in FIG. 6, the exposed portions of photoresists 300, 500 are subsequently removed in a development procedure utilizing, e.g., wet developer chemicals such as MIF319. The portions of photoresists 300, 500 masked by features 100, 400 remain in place, forming (along with features 100, 400) a mold 610 containing substantially empty recesses 620. Coating 200 typically remains on substrate 110 within recesses 620 (and on features 100 below photoresist 300) during the above-described process.

Figure 7:
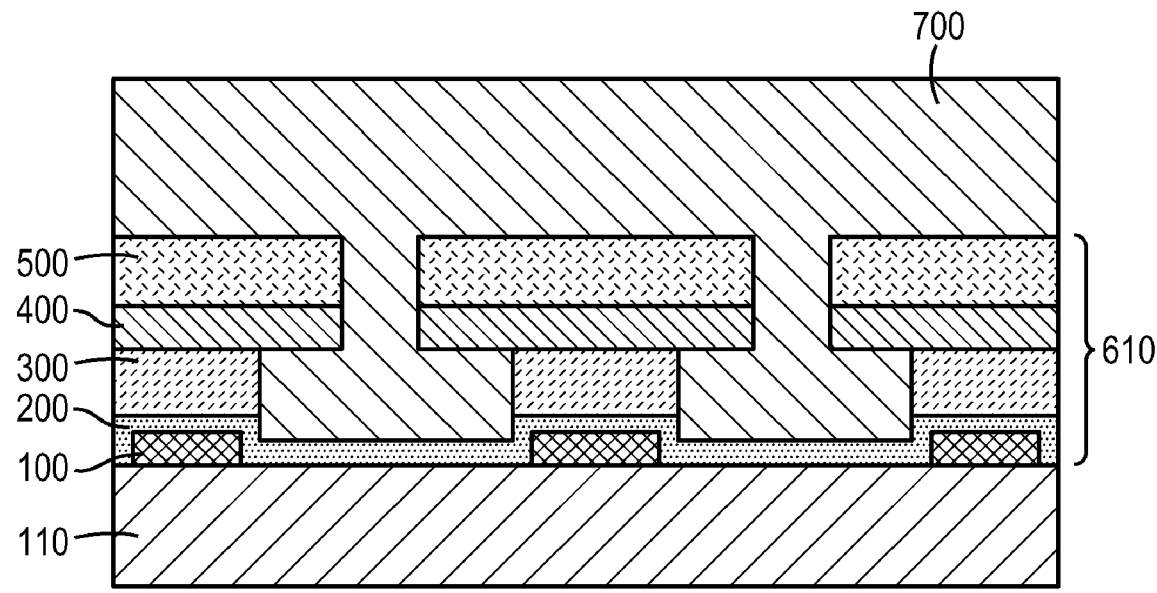
Figure 8:
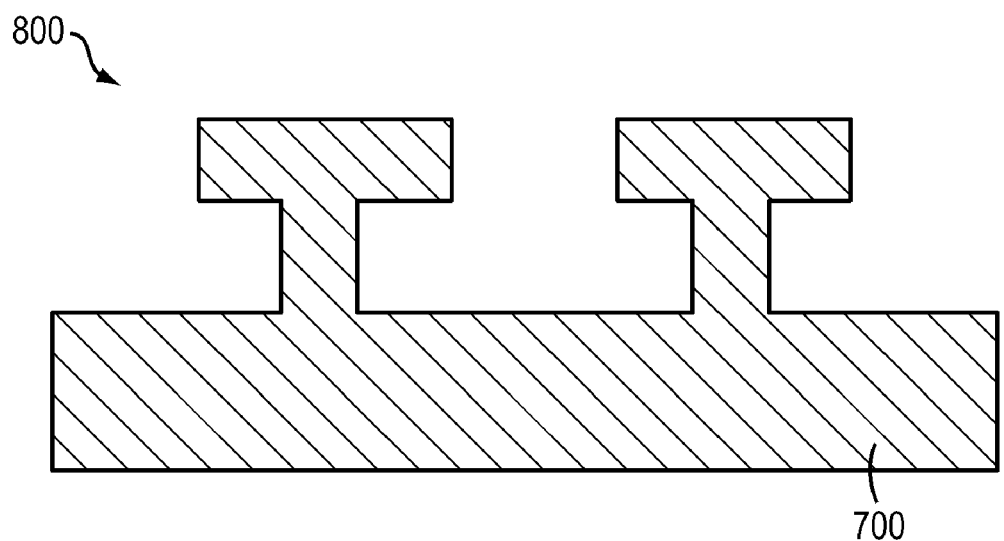

Referring now to FIGS. 7 and 8, a cast material 700 is deposited over mold 610, at least substantially covering mold 610 and at least substantially filling recesses 620. Preferably, a top surface of cast material 700 is substantially planar after deposition and filling of recesses 620. Cast material 700 may include or consist essentially of any material capable of flowing into recesses 620 and setting without damaging mold 610. In an embodiment, cast material 700 includes or consists essentially of a polymer, e.g., a polyurethane-based material such as CLEAR-FLEX 50, available from Smooth-On, Inc. of Euston, Pa., or a silicone such as polydimethylsiloxane (e.g., SYLGARD 184, available from Dow Corning Corporation of Midland, Mich.). After deposition, at least a portion of cast material 700 may be cured (e.g., hardened by annealing at elevated temperature (preferably below the transition temperature of coating material 200) or by exposure to actinic (e.g., UV) radiation), thus becoming substantially rigid. Coating material 200 is subsequently heated above its transition temperature, and cast material 700 is released from substrate 110, thus forming cast 800. In an embodiment, cast material 700 is released by applying (e.g., by immersion) hot water to cast material 700, mold 610, coating material 200, and substrate 110. Upon application of heat above the transition temperature, coating material 200 typically at least partially melts, thus releasing cast material 700 and portions of mold 610 (e.g., photoresists 300, 500 and features 400) from substrate 110. In an embodiment, cast 800 is substantially free of residual coating material 200 after release. After completion, cast 800 may include complex three-dimensional features, as shown in FIG. 8, fabricated without complicated deposition and etch steps and without traditional sacrificial layers (which require complex or specialized etch steps and/or etch chemistries, and which may leave residue on the completed cast). After release of cast 800, substrate 110 and/or a portion of mold 610 may be reused to form additional casts 800 in accordance with the above-described procedure.

Figure 9:
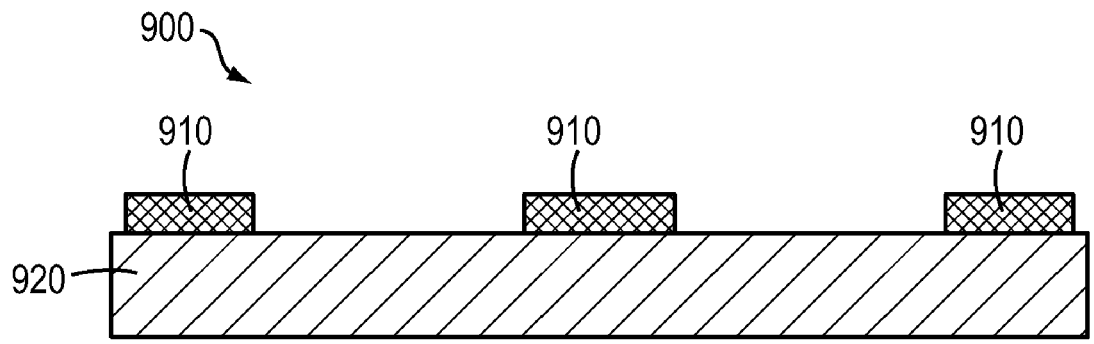
FIGS. 9-12 are cross-sectional views of a process sequence utilizing a release coating for fabricating a patterned structure in accordance with another embodiment of the invention.

FIGS. 9-12 depict fabrication of a structure using a release coating in accordance with another embodiment of the present invention. In FIG. 9, a mold 900 includes features 910 on a substrate 920. Substrate 920 may include or consist essentially of a rigid material, e.g., a semiconductor material such as silicon. In an embodiment, substrate 920 is substantially opaque. Features 910 may include or consist essentially of a rigid material, e.g., a dielectric material such as silicon dioxide and/or silicon nitride. Features 910 may be formed by deposition of a uniform layer followed by lithographic patterning and etching. In another embodiment, features 910 are parts of substrate 920 itself formed by, e.g., patterning and etching of areas of substrate 920 between features 910.

Figure 10:
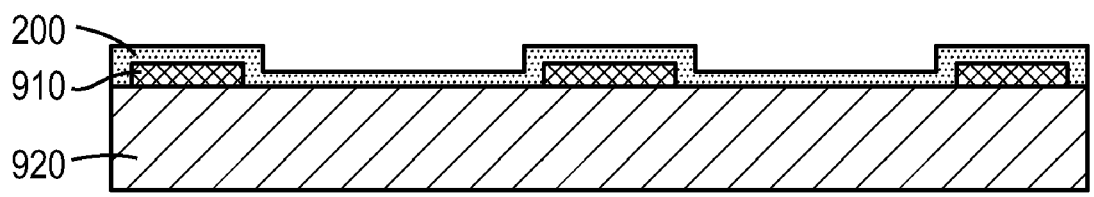
Figure 11:
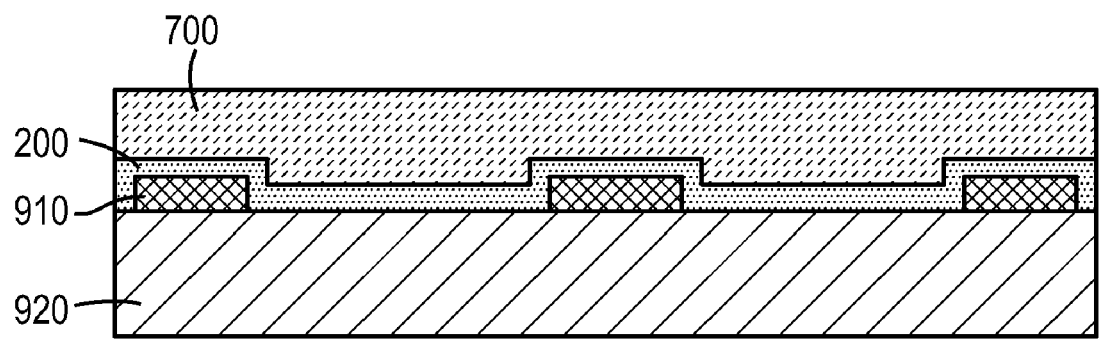
Figure 12:
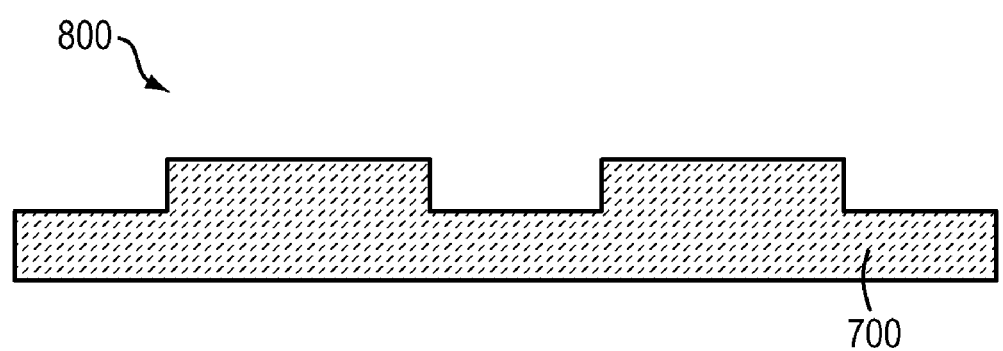

Referring to FIGS. 10-12, substrate 920 and features 910 are coated with the release coating material 200 described above. Cast material 700 is then applied over coating material 200, at least substantially covering coated features 910 and the coated top surface of substrate 920, at a temperature below the transition temperature of coating material 200. After cast material 700 is deposited, it preferably has a substantially planar top surface and preferably fills the "gaps" between coated features 910. Cast material 700 is then hardened by, e.g., curing. The curing may be performed at a temperature between room temperature and the transition temperature of coating material 200, e.g., between approximately 60° C. and approximately 75° C., or may even be performed at approximately room temperature. After curing, coating material 200 is heated above its transition temperature, and cast material 700 is released from mold 900, thus forming cast 800. In an embodiment, cast material 700 is released by applying (e.g., by immersion) hot water to cast material 700, mold 900, and coating material 200. Upon application of heat above the transition temperature, coating material 200 typically at least partially melts, thus releasing cast material 700 from mold 900. In an embodiment, cast 800 is substantially free of residual coating material 200 after release. After release of cast 800, mold 900 may be reused to form additional casts 800 in accordance with the above-described procedure.

Exemplary Advantages

The release coatings and the molding techniques described herein feature several advantages. For example, the release coatings provide a safe and reliable method for release from a substrate after complex patterning. Since, in various embodiments, the coatings are composed of aqueous components and are water-soluble above temperatures of approximately 80° C., they preserve complex micro/nanostructures being molded. Furthermore, such micro/nanostructures are typically processed with special solvents or harsh chemicals such as bases (e.g., lithography developers) and acids (e.g., etchants). The release coatings described herein are robust to and do not interfere with such processing.

Moreover, the release coatings may be utilized for transfer of thin metal films or recovery of any type of metallic structure, such as high-aspect-ratio patterns in LIGA processes (i.e., lithography, electroplating, and molding processes). The release coatings also enable a reliable and low-cost solution to nanopattern release. For example, the release layer may simply dissolve in hot water, a process compatible with metals, and allows processing flexibility not typically achievable in traditional metal-release methods that require complex sacrificial layer etching.

The release coatings are also cost-effective and simple to manufacture. As mentioned, in one embodiment, the release coating is obtained by dissolving an agarose precursor into hot water. Release coatings in accordance with embodiments of the invention do not consist of complex chemistries, and do not require elaborate chemical synthesis for fabrication. Application of the release coating is also straightforward and compatible with common techniques for photoresist coating. Nanometer-thickness coatings that are non-destructive when applied to existing micro/nanofeatures may be achieved.

Furthermore, the release coatings have relatively high transition temperatures and are truly switchable adhesive layers. At a low temperature, a release coating in accordance with embodiments of the invention promotes excellent wettability, facilitating photoresist coating and patterning on the coating. And, at high temperatures, the release coating liquefies and releases overlying structures. Release coatings in accordance with embodiments of the invention employ a simple and reliable release mechanism—a phase transition. In addition, water solubility of various release coatings facilitates release and removal of the release coating without leaving residue on a mold or a finished part.

Additional Applications

In various embodiments of the invention, the above-described release coatings may be used as thermal-release compounds for de-molding, lift-off of micro/nanopatterns, and/or as a non-destructive method of releasing devices or self-assembled/multilayered structures. The release coatings may also be used in optics for index of refraction matching or as a waveguide coating. The release coating may also include various biological molecules and/or chemicals to create thin-film chemical surfaces that are easily applied and removed via application of heat. It may also be used as a non-toxic wetting agent. The release coating may also be used in water-soluble lift-off processes by subsequent thin-film deposition and then immersion in hot water to dissolve the release coating.

Nano-imprint lithography ("NIL") is rapidly becoming a preferred high-throughput, low-cost patterning technique. The release coatings described herein may enhance NIL techniques by providing a material that is compatible with photoresists and their developers for forming the negative of a particular pattern. Instead of using expensive image-reversal resists, which may not provide nanometer resolution without expensive processing and equipment, NIL may first be implemented to imprint a pattern on a standard resist layer. Subsequently, the voids in the resist may be filled with the release coating. Upon UV flood exposure and development, the resist is dissolved, leaving behind the patterns formed by the release coating. Thus, the release coating may be utilized for improved nano-pattern quality and low-cost, high-throughput manufacturing of nanohole metallic films for, e.g., medical diagnostic devices, labs-on-chips, and nanoscale optical diffraction patterns.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method for forming a nano/microstructure, the method comprising:
    applying a release coating having a transition temperature to a mold, the release coating promoting adhesion thereto at temperatures below the transition temperature and release at temperatures above the transition temperature, the release coating consisting essentially of agarose dissolved in water;
    adhering a cast material to the release coating at a first temperature below the transition temperature; and
    releasing the cast material from the mold by exposing the release coating to a second temperature greater than the transition temperature.

2. The method of claim 1, further comprising curing the cast material without affecting the transition temperature or adhesive properties of the release coating.

3. The method of claim 2, wherein the curing step comprises exposing the cast material to actinic radiation.

4. The method of claim 3, wherein the actinic radiation comprises ultraviolet radiation.

5. The method of claim 3, wherein the mold is transparent to the actinic radiation and the cast material is exposed through the mold.

6. The method of claim 2, wherein the curing step comprises heating to a temperature below the transition temperature.

7. The method of claim 1, further comprising forming a portion of the mold after application of the release coating, the formation comprising exposing the portion of the mold to actinic radiation without affecting the transition temperature or adhesive properties of the release coating.

8. The method of claim 7, wherein the actinic radiation comprises ultraviolet radiation.

9. The method of claim 1, wherein the release coating is applied to the mold by spin coating.

10. The method of claim 1, wherein the cast material is released from the mold by immersing the cast material, the mold, and the release coating in water having the second temperature.

11. The method of claim 1, wherein releasing the cast material from the mold comprises liquefying the release coating.

12. The method of claim 1, wherein the cast material is substantially free of residual release coating after release.

13. The method of claim 1, wherein a thickness of the release coating ranges from approximately 10 nm to approximately 50 nm.

14. The method of claim 1, wherein the transition temperature is greater than 36° C.

15. The method of claim 1, wherein the transition temperature is greater than approximately 80° C.

16. The method of claim 1, wherein the release coating is substantially insensitive to ultraviolet radiation.

17. The method of claim 1, wherein the release coating is a hydrogel.

18. The method of claim 1, wherein the release coating comprises an additive not contributing to adhesive properties of the release coating.

19. The method of claim 18, wherein the additive is at least one of a coloring agent or a fluorescing agent.

20. The method of claim 1, wherein the mold comprises a substrate having raised features thereon.

21. The method of claim 20, wherein the substrate comprises silicon.

22. The method of claim 20, wherein the substrate comprises glass.

23. The method of claim 20, wherein the raised features comprise a plurality of layers, at least one of which comprises photoresist and at least one of which comprises a metal.

24. The method of claim 1, further comprising processing the cast material with at least one of an acid or a base, the processing not affecting the transition temperature or adhesive properties of the release coating.

25. The method of claim 1, further comprising subjecting the cast material to a LIGA process, the process not affecting the transition temperature or adhesive properties of the release coating.

* * * * *